(12) United States Patent
Kim et al.

(10) Patent No.: US 9,281,230 B2
(45) Date of Patent: Mar. 8, 2016

(54) APPARATUS FOR MANUFACTURING A HIERARCHICAL STRUCTURE

(75) Inventors: Jae-Hyun Kim, Daejeon (KR); Hak-Joo Lee, Daejeon (KR); Seung-Min Hyun, Daejeon (KR); Seung-Woo Han, Daejeon (KR); Byung-Ik Choi, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 1364 days.

(21) Appl. No.: 13/122,240

(22) PCT Filed: Sep. 28, 2009

(86) PCT No.: PCT/KR2009/005527
§ 371 (c)(1),
(2), (4) Date: Dec. 29, 2011

(87) PCT Pub. No.: WO2010/038963
PCT Pub. Date: Apr. 8, 2010

(65) Prior Publication Data
US 2012/0118506 A1 May 17, 2012

(30) Foreign Application Priority Data

Oct. 1, 2008 (KR) .......................... 10-2008-0096815

(51) Int. Cl.
*H01L 21/683* (2006.01)
*B29C 43/46* (2006.01)
(Continued)

(52) U.S. Cl.
CPC .......... *H01L 21/6836* (2013.01); *B29C 47/067* (2013.01); *H01L 24/83* (2013.01);
(Continued)

(58) Field of Classification Search
CPC ............. H01L 2924/1461; H01L 2924/00; H01L 21/683; H01L 2221/635; H01L 224/7565; H01L 2224/83192; H01L 2224/838; H01L 2224/95145; H01L 24/08; H01L 24/95; H01L 25/0652; H01L 2924/01005; H01L 2924/01006; H01L 2924/01013; H01L 2924/01019; H01L 2924/01033; H01L 2924/01047; H01L 2924/01057; H01L 2924/01082; Y10T 156/1705; Y10T 156/1092; Y10T 156/1097; Y10T 156/1195; Y10T 156/1744; Y10T 156/195; Y10T 156/1994; B29C 47/52; B29C 2043/463; B29C 47/067; B32B 37/00; B32B 27/00; B29L 2009/00; B29L 2009/003; B29L 2009/005
USPC .......... 156/231, 235, 242, 449, 500, 581, 582
See application file for complete search history.

(56) References Cited

U.S. PATENT DOCUMENTS 7,802,599 B2 * 9/2010 Hunahata ................. B41M 1/00
156/235

(Continued)

FOREIGN PATENT DOCUMENTS

| JP | 2003-045901 | 2/2003 |
| JP | 2003-324142 | 11/2003 |
| JP | 2006-339608 | 12/2006 |

OTHER PUBLICATIONS

English translation of JP2003-045901; Feb. 14, 2003.*
(Continued)

*Primary Examiner* — Sonya Mazumdar
(74) *Attorney, Agent, or Firm* — Pearl Cohen Zedek Latzer Baratz LLP

(57) ABSTRACT

The present invention relates to an apparatus for massive manufacturing a hierarchical structure that can hierarchically form high performance micro units one a flexible substrate. For this purpose, an apparatus for manufacturing a hierarchical structure according to the present invention is provided to layer micro units provided on a dummy substrate that is made of a hard material on a target substrate that is made of a flexible material by releasing the micro units from the dummy substrate. The apparatus includes: a transfer stage flat-transferring the dummy substrate by supporting the same and a main roller rolling the target substrate by winding the same as the transfer stage proceeds and layering the micro unit of the dummy substrate on the target substrate.

27 Claims, 10 Drawing Sheets

(51) Int. Cl.
  *B29C 43/48* (2006.01)
  *B29C 47/06* (2006.01)
  *B32B 27/00* (2006.01)
  *H01L 23/02* (2006.01)
  *B29L 9/00* (2006.01)
  *H01L 23/00* (2006.01)
  *H01L 25/065* (2006.01)

(52) U.S. Cl.
  CPC .......... *H01L 24/95* (2013.01); *B29C 2043/463* (2013.01); *H01L 24/80* (2013.01); *H01L 25/0652* (2013.01); *H01L 2221/68359* (2013.01); *H01L 2221/68368* (2013.01); *H01L 2224/27312* (2013.01); *H01L 2224/7565* (2013.01); *H01L 2224/838* (2013.01); *H01L 2224/83192* (2013.01); *H01L 2224/95145* (2013.01); *H01L 2924/01005* (2013.01); *H01L 2924/01006* (2013.01); *H01L 2924/01013* (2013.01); *H01L 2924/01019* (2013.01); *H01L 2924/01033* (2013.01); *H01L 2924/01047* (2013.01); *H01L 2924/01057* (2013.01); *H01L 2924/01082* (2013.01); *H01L 2924/1461* (2013.01); *Y10T 156/1195* (2015.01); *Y10T 156/1705* (2015.01); *Y10T 156/1744* (2015.01)

(56) References Cited

U.S. PATENT DOCUMENTS

| | | | |
|---|---|---|---|
| 2006/0280912 A1* | 12/2006 | Liang | H01B 1/22 428/173 |
| 2007/0138131 A1 | 6/2007 | Burdinski | |
| 2008/0157235 A1* | 7/2008 | Rogers | H01L 21/02628 257/415 |

OTHER PUBLICATIONS

English translation of JP2003-324142; Nov. 14, 2003.*
English translation of JP2006-339608; Dec. 14, 2006.*
International Search Report from International Application No. PCT/KR2009/005527 mailed on May 31, 2010.

* cited by examiner (a)

(b)

APPARATUS FOR MANUFACTURING A HIERARCHICAL STRUCTURE

CROSS-REFERENCE TO RELATED APPLICATIONS

This application is a National Phase Application of PCT International Application No. PCT/KR2009/005527, International Filing Date Sep. 28, 2009, claiming priority of Korean Patent Application No. 10-2008-0096815, filed Oct. 1, 2008, both of which are incorporated by reference herein.

FIELD OF INVENTION

The present invention relates to an apparatus for manufacturing a hierarchical structure. More particularly, the present invention relates to an apparatus for manufacturing a hierarchical structure. That is, a mass production manufacturing apparatus that can hierarchically form high performance micro units on a flexible substrate.

BACKGROUND OF INVENTION

A technology related to a silicon semiconductor has been rapidly developed, and not only the silicon semiconductor but also various compound semiconductors can process mass data with high speed so that they offer great assistance to the human life in an optical element, optical communication, and wireless communication, leading IT revolution.

The semiconductor-associated technology has been focused on high performance, large capacity, and ultrahigh speed through improvement of the degree of integration of the semiconductor. However, recently, a semiconductor-associated processing technology has been extended to a nano area so that the technology has a limit in improvement of the degree of integration.

As the semiconductor-associated technology shows the limit in the improvement of the integration, several persons skilled in the art determine that the flexible product will lead the future IT industry, and thus, recently, various technologies related to flexible IT products have been developed.

Meanwhile, a conventional flexible product manufacturing technology focused on using various polymer-based organic materials, but the product using the organic material has a drawback in poor performance compared to a silicon semiconductor or a compound semiconductor. The reason is that the electron transfer speed of the organic-based electron is 100 to 1,000 times slow compared to a single-crystalline silicon electron, and more than 10,000 times slow compared to a carbon nanotube.

On the contrary, the silicon semiconductor or the compound semiconductor has excellent performance but also has strong brittleness so that it cannot be easily deformed and application to a flexible product is not ease.

In order to solve such a problem, a technology for developing a flexible product such as a high performance flexible display, a flexible memory, or a flexible solar battery by forming a high performance semiconductor, structure, or nano material on a flexible substrate has been actively researched.

Therefore, an apparatus that can manufacture high performance flexible products through mass production by forming an element or structure having strong brittleness on a flexible substrate is required.

SUMMARY OF THE INVENTION

The present invention has been made in an effort to provide an apparatus for manufacturing a hierarchical structure that can massively manufacture high performance and flexible hierarchical structure by arranging and layering a silicon semiconductor, a compound semiconductor, and a nano structure having excellent performance on a flexible target substrate.

An apparatus for manufacturing a hierarchical structure according to an exemplary embodiment of the present invention is provided to layer micro units provided on a dummy substrate that is made of a hard material on a target substrate that is made of a flexible material by releasing the micro units from the dummy substrate. The apparatus includes: a transfer stage flat-transferring the dummy substrate by supporting the same and a main roller rolling the target substrate by winding the same as the transfer stage proceeds and layering the micro unit of the dummy substrate on the target substrate.

Preferably, an adhering process means is provided at one side of the main roller to provide adhering force that is stronger than adhering force between the dummy substrate and the micro unit between the target substrate and the micro unit.

Preferably, the adhering process means is a surface treating device using plasma.

Preferably, the adhering process means is a surface treating device using self-assembled monolayers (SAMs).

Preferably, the adhering process means is an irradiation device irradiating laser, ultraviolet rays, or ion beams.

Preferably, the adhering process means is formed as a temperature control device that controls the temperature of the target substrate to be lower than the temperature of the dummy substrate.

Meanwhile, a location of the main roller can be changed to control a distance with the dummy substrate.

The main roller enables angle displacement to control an angle formed with the dummy substrate.

An apparatus for manufacturing a hierarchical structure according to another exemplary embodiment of the present invention is provided to layer a micro unit provided on a dummy substrate that is formed of a hard material on a target substrate that is formed of a flexible material by releasing the micro unit. The apparatus includes: a transfer state flat-transferring the dummy substrate by supporting the same; a sub roller rotating with pressure while being in contact with the dummy substrate and making the micro unit of the dummy substrate attached to an external circumference thereof; and a main roller making the micro unit attached to the external circumference of the sub roller layered on the target substrate by rolling the target substrate to make the sub roller and the target substrate press each other.

Preferably, a first adhering process means is provided at one side of the sub roller to provide adhering force that is stronger than adhering force between the dummy substrate and the micro unit between the sub roller and the micro unit.

Preferably, the first adhering process means is a surface treating device using plasma.

Preferably, the first adhering process means is a surface treating device using self-assembled monolayers (SAMs).

Preferably, the first adhering process means is an irradiation device irradiating laser, ultraviolet rays, or ion beams.

Preferably, the first adhering process means is formed as a first temperature control device that controls the temperature of an external circumference of the sub roller to be lower than the temperature of the dummy substrate.

Preferably, a second adhering process means is provided at the other side of the main roller to provide adhering force that is stronger that adhering force between the sub roller and the micro unit between the target substrate and the micro unit.

Preferably, the second adhering process means is a surface treating device using plasma.

Preferably, the second adhering process means is a surface treating device using self-assembled monolayers (SAMs).

Preferably, the second adhering process means is an irradiation process irradiating laser, ultraviolet rays, or ion beams.

Preferably, the second adhering process means is formed as a second temperature control device that controls the temperature of the target substrate to be lower than the temperature of the external circumference of the sub roller.

Preferably, a first adhering process means is provided at one side of the sub roller to provide adhering force that is stronger than adhering force between the dummy substrate and the micro unit between the sub roller and the micro unit, a second adhering process means is provided at the other side of the sub roller to provide adhering force that is stronger that adhering force between the sub roller and the micro unit between the target substrate and the micro unit.

Preferably, the adhering force between the sub roller and the micro unit, provided by the first adhering process means is weaker than the adhering force between the target substrate and the micro unit, provided by the second adhering process means.

Preferably, a location of the sub roller can be changed to control a distance with the dummy substrate.

Preferably, the sub roller enables angle displacement to control an angle formed with the dummy substrate.

Preferably, a location of the main roller can be changed to control a distance with the sub roller.

Preferably, the main roller enables angle displacement to control an angle formed with the sub roller.

Preferably, the sub roller has a predetermined pattern at an external circumference thereof.

An apparatus for manufacturing a hierarchical structure according to another exemplary embodiment of the present invention is provided to layer a micro unit provided on a dummy substrate that is formed of a hard material on a target substrate that is formed of a flexible material by releasing the micro unit. The apparatus includes: a transfer stage flat-transferring the dummy substrate by supporting the same; a first sub roller disposed close to the dummy substrate; a second sub roller disposed at a predetermined distance from the first sub roller and close to the target substrate; a ring belt circulated by being wound to the first and second sub rollers, pressed while being in contact with the dummy substrate by the first sub roller such that the micro unit of the dummy substrate is attached thereto, and pressed while being in contact with the target substrate by the second sub roller such that the micro unit is layered on the target substrate; and a first tension roller disposed at a supply side of the target substrate and a second tension roller disposed at an emission side of the target substrate to make the ring belt and the target belt press each other by the second sub roller.

Preferably, a third adhering process means is provided at one side of the first sub roller to provide adhering force that is stronger than adhering force between the dummy substrate and the micro unit between the first sub roller and the micro unit.

Preferably, the third adhering process means is a surface treating device using plasma.

Preferably, the third adhering process means is a surface treating device using self-assembled monolayers (SAMs).

Preferably, the third adhering process means is an irradiation device irradiating laser, ultraviolet rays, or ion beams.

Preferably, the third adhering process means is formed as a third temperature control device that controls the temperature of the ring belt to be lower than the temperature of the dummy substrate.

Preferably, a fourth adhering process means is provided at one side of the second sub roller to provide adhering force that is stronger than adhering force between the first sub roller and the micro unit between the target substrate and the micro unit.

Preferably, the fourth adhering process means is a surface treating device using plasma.

Preferably, the fourth adhering process means is a surface treating device using self-assembled monolayers (SAMs).

Preferably, the fourth adhering process means is an irradiation device irradiating laser, ultraviolet rays, or ion beams.

Preferably, the fourth adhering process means is formed as a fourth temperature control device that controls the temperature of the target substrate to be lower than the temperature of the ring belt.

Preferably, a third adhering process means is provided at one side of the first sub roller to provide adhering force that is stronger that adhering force between the dummy substrate and the micro unit between the first sub roller and the micro unit, and a fourth adhering process means is provided at one side of the second sub roller to provide adhering force that is stronger than adhering force between the first sub roller and the micro unit between the target substrate and the micro unit.

Preferably, adhering force between the first sub roller and the micro unit, provided by the third adhering process means is weaker than adhering force between the target substrate and the micro unit, provided by the fourth adhering process means.

Preferably, a spray nozzle is provided at one side of the second tension roller to spray coating solution to a target substrate where the micro unit is layered.

Preferably, a first polymer layer integrally formed at one side of a metal sheet of the ring belt, and the micro unit of the dummy substrate is attached to the first polymer layer.

Preferably, the ring belt is formed in the shape of the Mobuis strip and a second polymer layer is integrally formed at the other end of the metal sheet, and the micro unit of the dummy unit is attached to the first and second polymer layers.

Preferably, locations of the first and second tension rollers can be changed to control the pressure degree between the ring belt and the target substrate by the second sub roller.

Preferably, an alignment control module is provided at a location facing the second sub roller to monitor alignment of the micro unit layered on the target substrate and control the alignment of the micro unit.

An apparatus for manufacturing a hierarchical structure according to another exemplary embodiment of the present invention is provide to layer a micro unit provided on a dummy substrate that is made of a hard material on a target substrate that is made of a flexible material by releasing the micro unit. The apparatus includes: a transfer state flat-transferring the dummy substrate by supporting the same; a sub roller disposed close to the dummy substrate; a main roller disposed at a predetermined distance from the sub roller and close to the target substrate; and a ring belt circulated by being wound to the sub roller and the main roller, pressed while being in contact with the dummy substrate by the sub roller such that the micro unit of the dummy substrate is attached thereto, and pressed while being in contact with the target substrate by the main roller such that the micro unit is layered on the target substrate. The target substrate is supplied between the main roller and one side of the ring belt and emitted between the main roller and the other side of the ring belt.

Preferably, a fifth adhering process means is provided at one side of the sub roller to provide adhering force that is stronger than adhering force between the dummy substrate and the micro unit between the ring belt and the micro unit.

Preferably, the fifth adhering process means is a surface treating device using plasma.

Preferably, the fifth adhering process means is a surface treating device using self-assembled monolayers (SAMs).

Preferably, the fifth adhering process means is an irradiation device irradiating laser, ultraviolet rays, or ion beams.

Preferably, the fifth adhering process means is formed as a fifth temperature control device that controls the temperature of the ring belt to be lower than the temperature of the dummy substrate.

Preferably, a sixth adhering process means is provided at one side of the main roller to provide adhering force that is stronger than adhering force between the ring belt and the micro unit between the target substrate and the micro unit.

Preferably, the sixth adhering process means is a surface treating device using plasma.

Preferably, the sixth adhering process means is a surface treating device using self-assembled monolayers (SAMs).

Preferably, the sixth adhering process means is an irradiation device irradiating laser, ultraviolet rays, or ion beams.

Preferably, the sixth adhering process means is formed as a sixth temperature control device that controls the temperature of the target substrate to be lower than the temperature of the ring belt.

Preferably, a fifth adhering process means is provided at one side of the sub roller to provide adhering force that is stronger than adhering force between the dummy substrate and the micro unit between the ring belt and the micro unit, and a sixth adhering process means is provided at one side of the main roller to provide adhering force that is stronger than adhering force between the ring belt and the micro unit between the target substrate and the micro unit.

Preferably, the adhering force between the ring belt and the micro unit, provided by the fifth adhering process means is stronger than the adhering force between the target substrate and the micro unit, provided by the sixth adhering process means.

Preferably, a third polymer layer is integrally formed at one side of a metal sheet of the ring belt, and the micro unit of the dummy substrate is attached to the third polymer layer.

Preferably, the ring belt is formed in the shape of the Mobuis strip and a fourth polymer layer is integrally formed at the other end of the metal sheet, and the micro unit of the dummy unit is attached to the third and fourth polymer layers.

Preferably, a location of the main roller can be changed to control the pressure degree between the ring belt and the target substrate.

The effects of the prevent invention are as follow.

First, high performance elements and structures developed based on conventional semiconductor technology and nano technology can be formed on a flexible substrate. Through this, performance improvement may be 10 to 100 times of a conventional flexible product using an organic material. For example, the charge transfer speed of an organic semiconductor that has been tried to be applied to a flexible product is lower than one to one hundredth compared to that of the silicon semiconductor, and therefore the data processing speed of the organic semiconductor is deteriorated more than 100 times compared to the silicon semiconductor.

Second, productivity can be remarkably improved. The merit of the printed electronics using a conventional roll-to-roll printing is improvement of productivity, and the present invention also remarkably improve productivity through a manufacturing system using a roller and a belt.

Third, a product can be manufacture by mass-assembling large-scaled various elements and structures. A conventional roll-to-roll printing technology has limits in manufacturing of a structure that is smaller than 10 to 20 um, but the manufacturing system according to the present invention can overcome the size limit and various-scaled elements and structures can be hierarchically assembled to manufacture a product.

DESCRIPTION OF SYMBOLS

| | |
|---|---|
| DS: dummy substrate | TS: target substrate |
| U: micro unit | 110: transfer stage |
| 120: main roller | 130: adhering process means |
| 210: transfer stage | 220: sub roller |
| 230: main roller | 240: first adhering process means |
| 250: second adhering process mean | 310: transfer stage |
| 320: first sub roller | 330: second sub roller |
| 340: ring belt | 342: metal sheet |
| 344: first polymer layer | 346: second polymer layer |
| 350: first tension roller | 360: second tension roller |
| 370: third adhering means | 380: fourth adhering means |
| 390: spray nozzle | 395: alignment control module |
| 410: transfer stage | 420: sub roller |
| 430: main roller | 440: ring belt |
| 442: metal sheet | 444: third polymer layer |
| 446: fourth polymer layer | 470: fifth adhering means |
| 480: sixth adhering means | |

DETAILED DESCRIPTION OF THE INVENTION

The present invention will be further clear through preferable exemplary embodiments described with reference to the accompanying drawings. Hereinafter, exemplary embodiments of the present invention will be described in further detail for easy comprehension and realization of a person of an ordinary skill in the art.

A basic concept for realizing a high performance flexible product is to layer a micro unit on a flexible target substrate. The micro unit is manufactured using a conventional technology, and includes a high performance silicon semiconductor, a compound semiconductor, a micro structure, and a nano structure.

The silicon semiconductor and the compound semiconductor manufactured using the conventional technology have strong brittleness, are not easily bent, and tend to be broken by bending load so that they cannot be applied to flexible products.

In addition, since the silicon semiconductor and the compound semiconductor are manufactured with 900° C. or higher process temperature, a polymer-based substrate used as a flexible target substrate cannot endure the process temperature (i.e., 900° C.).

Therefore, the hierarchical structure will be manufacture through the following process: 1) freely manufacturing a micro unit such as a silicon semiconductor, a compound semiconductor, a micro structure, and a nano structure through high-temperature (i.e., 900° C. process) using a conventional semiconductor technology; 2) processing the micro unit for ease separation from a base through a wet etching or a dry etching process; and 3) separating the micro unit from the base and aligning and layering the separated micro unit on the flexible substrate.

The third process (i.e., 3)) will now be described in detail.

Figure 1:
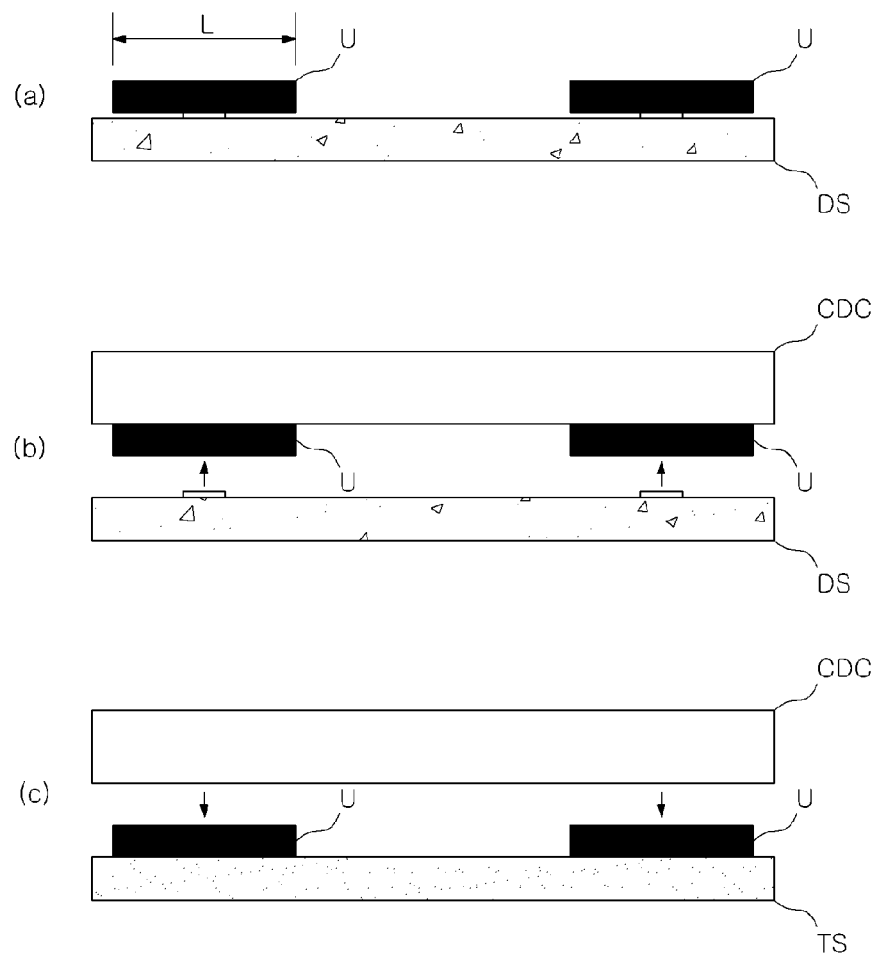
FIG. 1 shows a process for releasing a micro unit from a dummy substrate and layering the micro unit on a target substrate.

As shown in (a) of FIG. 1, a micro unit U is formed on a dummy substrate DS has strong brittleness such as a silicon wafer. The micro unit U has already experienced processes requiring high temperature, such as doping, oxidation, and rapid thermal processing (RTP) so that it may be formed with various materials according to application product, and may include an interconnection line for electrical connection and a nano structure for performance enhancement therein.

The micro unit U includes an element (a combination of structures that can independently perform a function) or a structure (or, a micro structure or a material that is assembled to other structure to perform a function rather than independently performing the function), and a characteristic length L of the micro unit U may be variously scaled within a range of 0.01 um-100 um. After a process required for the micro unit U is finished on the dummy substrate DS, a sacrificial layer needs to be appropriately used to easily release the micro unit U from the dummy substrate DS.

As shown in (b) of FIG. 1, the micro unit U formed on the dummy substrate DS is separated from the dummy substrate DS by attaching the micro unit U at the bottom surface of a conformal deformation chuck (CDC). The conformal deformation chuck CDC is formed of a polymer-base material having a very low elastic coefficient, and adhered or attached to an element or a structure using Van der Waals' force generated at a surface of the conformal deformation chuck CDC, electrostatic force, or chemical bonding force. The other main factor of the conformal deformation chuck CDC is flexible deformability. The dummy substrate DS, the target substrate TS, and the conformal deformation chuck CDC may experience deformation such as warpage, and therefore the conformal deformation chuck CDC needs to be made of a material having flexible deformability with a shape for contacting the conformal deformation chuck and the micro unit U with ease.

As shown in (c) of FIG. 1, the micro unit U is layered on the target substrate TS as the micro unit U attached to the conformal deformation chuck C contacts the target substrate TS. For this, adhering force between the conformal deformation chuck CDC and the micro unit U should be weaker than adhering force between the micro unit U and the target substrate TS. Thus, a method for control the adhering force is required. That is, when the adhering force between the target substrate TS and the micro unit U is stronger than the adhering force between the conformal deformation chuck CDC and the micro unit U, the micro unit U is layered on the target substrate TS by making the micro unit U attached to the conformal deformation chuck CDC in contact with the target TS. An academic base for transferring a metal thin film, a silicon nano ribbon, a nanotube, and the like to the target substrate TS using a polydimethylsiloxane (PDMS) chuck has already been studied.

Hereinafter, as shown in (a), (b), and (c) of FIG. 1, an apparatus for manufacturing a hierarchical structure for releasing a micro unit U provided on a dummy substrate DS made of a hard material to layer the same on a target substrate TS made of a flexible material will now be described in respective exemplary embodiments.

First Exemplary Embodiment

Figure 2:
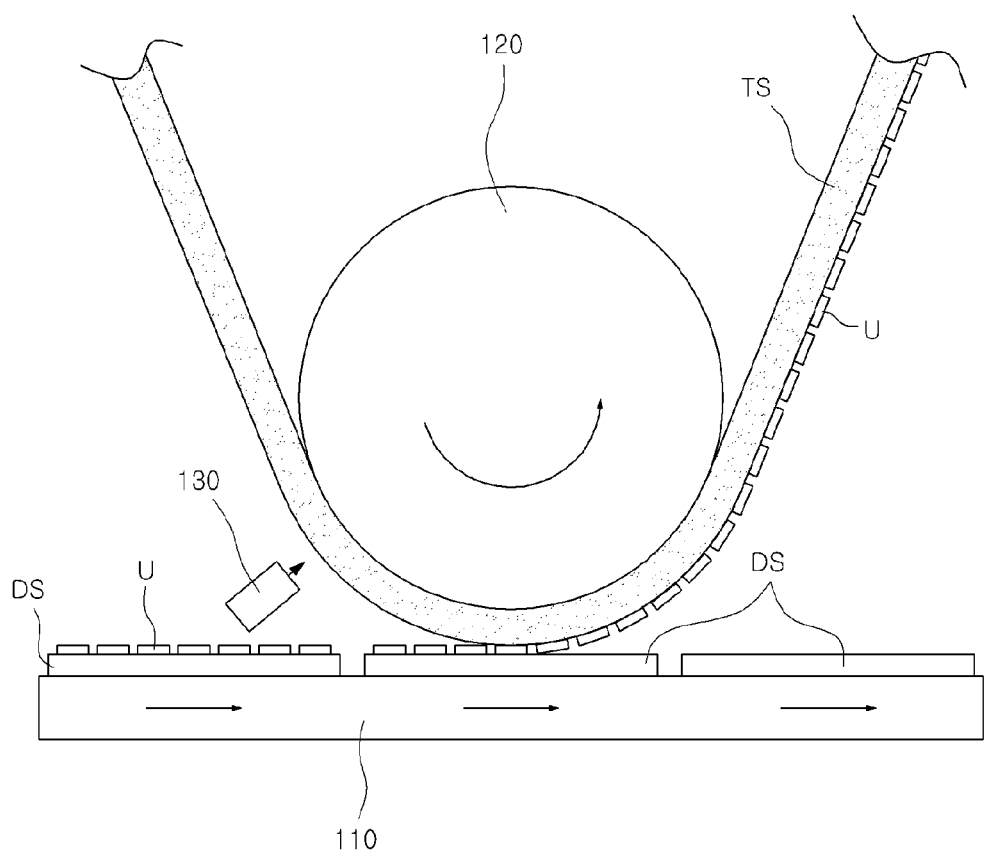
FIG. 2 shows a configuration of an apparatus for manufacturing a hierarchical structure according to a first exemplary embodiment of the present invention.

An apparatus for manufacturing a hierarchical structure according to the first exemplary embodiment releases a micro unit U provided on a dummy substrate DS made of a hard material to layer the same on a target substrate TS made of a flexible material, and includes a transfer stage 110 and a main roller 120, as shown in FIG. 2.

The transfer stage 110 is provided for flat-transferring of the dummy substrate DS by supporting the same, and for example, may be formed of a system such as a conveyor.

A micro unit U is provided on an upper surface of the dummy substrate DS flat-transferred by the transfer stage 110, and the micro unit U formed through a high-temperature process such as doping, oxidation, high-temperature thin film deposition, and RTP may include a high performance silicon semiconductor, a compound semiconductor, a micro structure, and a nano structure. The micro unit U may include an interconnection line for electrical connection and a nano structure for performance enhancement therein.

Materials widely used in the silicon semiconductor process and the compound semiconductor process, such as a silicon wafer, an alumina wafer, a glass wafer, and a quartz wafer, and all the materials have strong brittleness and cannot be easily bent. Thus, unlike a target substrate TS, the dummy substrate DS cannot be transferred using a roller so that a transfer stage 110 is used for flat-transferring of the dummy substrate DS.

The dummy substrate DS and the target substrate TS press each other as the main roller 120 winds the target substrate TS such that the micro unit U of the dummy substrate TS is layered on the target substrate TS. For example, the main roller 120 may be formed with a roller used in a typical roll-to-roll process system.

Here, a flexible polymer-based substrate is preferred to be used as the target substrate TS, and a material that can be easily purchased in the market may be used as the target substrate TS. The material includes PI, PET, or PES. A uniform polymer-based material may be used for the target substrate TS, but a substrate where metal wiring for electrical connection, that is, a flexible printed circuit board may be used as the target substrate TS. When the target substrate TS where the wiring has already been formed is used, alignment between the target substrate TS and the micro unit U is required, and when the micro unit U is formed on the dummy substrate DS, alignment with the micro unit U needs to be considered.

As shown in FIG. 2, the main roller 120 is located close to the micro unit U provided on an upper surface of the flat-transferred dummy substrate DS, and the target substrate TS is rolled by being wound to an external circumference portion of the main roller 120 and the location of the main roller 120 can be changed to make the target substrate TS and the micro unit U pressure each other.

That is, the location of the main roller 120 can be changed to control a gap with the dummy substrate DS. For example, the target substrate TS and the micro unit U press each other when the location of the main roller 120 is moved to a lower portion in FIG. 2, and the pressure between the target substrate TS and the micro unit U is released when the location of the main roller 120 is moved to an upper portion in FIG. 2.

As described, the target substrate TS and the micro unit U press each other or are released from each other by changing the location of the main roller 120 to the upper portion or the lower portion in FIG. 2. Further, the target substrate TS and the micro unit U press each other or are released from each other by enabling angle displacement between the main roller 120 and the dummy substrate DS.

That is, an angle between the main roller 120 and the dummy substrate DS may be changed according to the location of the main roller 120, and, for example, when a first end of the main roller 120 disposed in parallel with the dummy substrate DS is increased to the upper portion in FIG. 2 to make the main roller 120 and the dummy substrate DS press each other, an angle between the main roller 120 and the dummy substrate DS becomes an acute angle so that the pressure between the target substrate TS and the micro unit U is released.

Meanwhile, in order to make the micro unit U provided on the dummy substrate DS effectively attached and layered on the target substrate TS rolled by the main roller 120, an adhering process means 130 is provided at one side of the main roller 120 to provide stronger adhering force between the target TS and the micro unit U than adhering force between the dummy substrate DS and the micro unit U.

That is, when the adhering force between the dummy substrate DS and the micro unit U is "a" and the adhering force between the target substrate TS and the micro unit U is "b", the adhering process means 130 is provided to make the adhering force between the target substrate TS and the micro unit U equal to "b" for "a<b".

For example, a surface treating device using plasma, a surface treating device using self-assembled monolayers (SAMs), an irradiation device irradiating laser, ultraviolet rays, or ion beam, or a temperature control device may be used as the adhering process means 130.

A surface treating device using plasma is commonly used for a semiconductor or micro electro mechanical systems (MEMS) process, and the adhering process can be performed by treating the surface of the target substrate TS using the surface treating device.

The adhering process also can be performed by depositing SAMs on the surface of the target substrate TS using the surface treating device using SAMs.

Further, the adhering process can be performed by causing electrostatic force with irradiation of light on the surface of the target substrate TS using the irradiation device irradiating the laser, the ultraviolet rays, or the ion beams.

The temperature control device performs the adhering process by controlling the temperature of the target substrate TS. An adhering force between a target substrate TS made of a polymer material and the micro unit U is changed as an elastic coefficient of the polymer material is changed, and the adhering force is increased as the elastic coefficient is increased. The electric coefficient very sensitively responds to the temperature. That is, when the temperature is decreased, the elastic coefficient is increased and thus the adhering force is increased so that the adhering process can be performed.

Second Exemplary Embodiment

Figure 3:
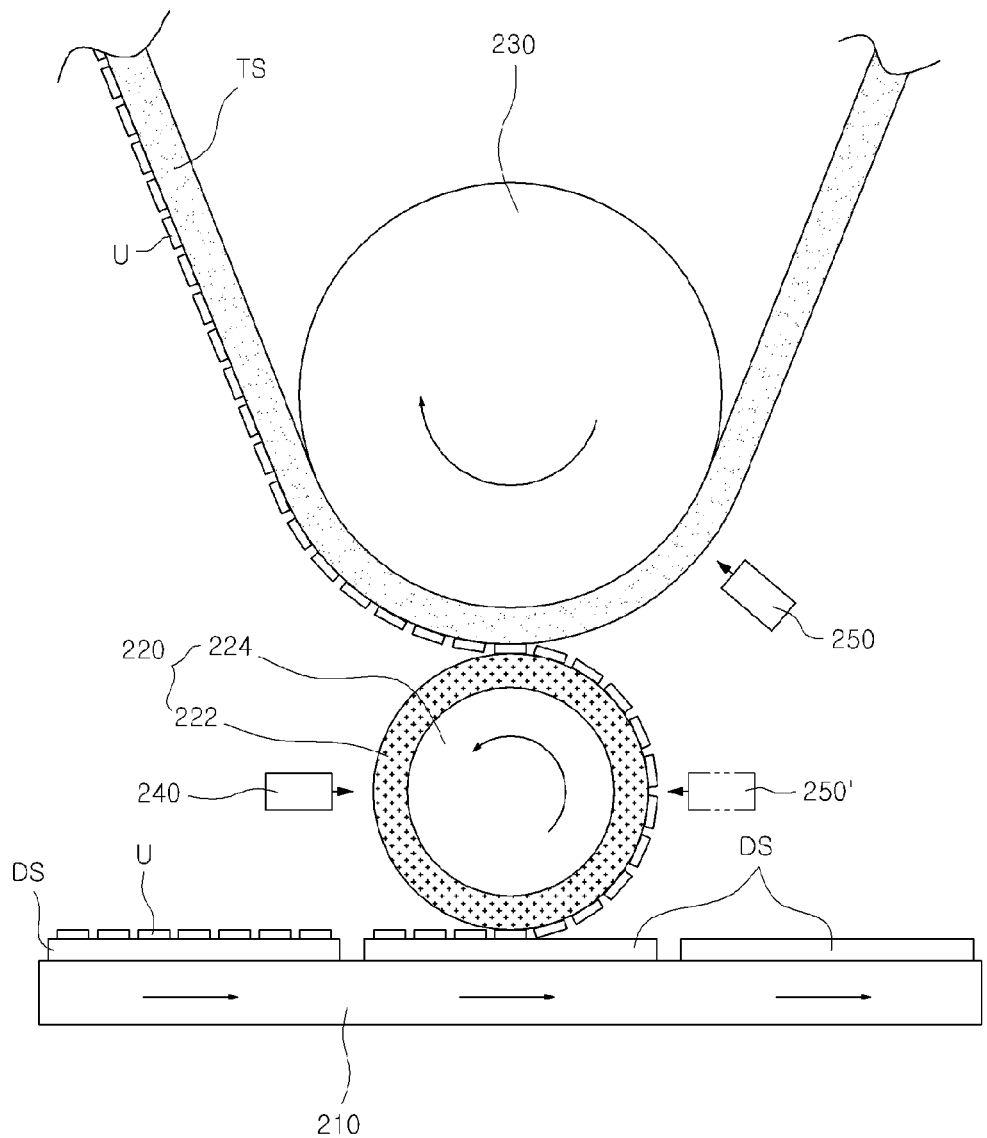
FIG. 3 shows a configuration of an apparatus for manufacturing a hierarchical structure according to a second exemplary embodiment of the present invention.

An apparatus for manufacturing a hierarchical structure according to the second exemplary embodiment includes a transfer stage 210, a sub roller 220, and a main roller 230 as shown in FIG. 3, and the transfer stage 210 is the same as the transfer stage 110 of the first exemplary embodiment and therefore no further description will be provided. A dummy substrate DS, a target substrate TS, and a micro unit U of the second exemplary embodiment are also the same as those of the first exemplary embodiment, and therefore no further description will be provided.

As the sub roller 220 contacts and the dummy substrate DS and thus rotates with pressure, the micro unit U of the dummy substrate DS is attached to an external circumference of the micro unit U. As shown in (a) of FIG. 4, the sub roller 220 is formed of a flexible polymer layer 222a and a core 224a. The polymer layer 222a as a predetermined thickness and the core 224a is formed strongly.

The polymer layer 222a is formed of a material having a low electric coefficient and high elongation so as to flexibly contact the micro unit U formed on the dummy substrate DS, and for example, a polymer-based material such as polydimethysiloxane (PDMS) may be used.

The core 224a may be formed of a material that is stronger than the polymer layer 222a and less deformative than the polymer layer 222a, and the material includes stain steel or aluminum.

As shown in FIG. 3, the sub roller 220 is disposed close to the micro unit U provided on an upper surface of the flat-transferred dummy substrate DS, and the location of the sub roller 220 can be changed to make the polymer layer 222a and the micro unit U press each other.

That is, the location of the sub roller 220 can be changed to control a distance with the dummy substrate DS. For example, when the sub roller 220 moves to a lower portion in FIG. 3, the polymer layer 222a of the sub roller 220 and the micro unit U press each other, and when the sub roller 220 moves to an upper portion in FIG. 3, the pressure between the polymer layer 222a of the sub roller 220 is released.

As described, the target substrate TS and the micro unit U press each other or are released from each other by moving the main roller 220 to the upper portion or the lower portion in FIG. 3. Further, the target substrate TS and the micro unit U may press each other or be released from each other by enabling angle displacement between the main roller 220 and the dummy substrate DS.

That is, That is, an angle between the sub roller 220 and the dummy substrate DS may be changed according to the location of the sub roller 220, and, for example, when a first end of the sub roller 220 disposed in parallel with the dummy substrate DS is increased to the upper portion in FIG. 3 to make the sub roller 220 and the dummy substrate DS press each other, an angle between the sub roller 220 and the dummy substrate DS becomes an acute angle so that the pressure between the target substrate TS and the micro substrate U is released.

The main roller 230 rolls the target substrate TS by winding the same to make the sub roller 220 and the target substrate TS press each other such that the micro unit U attached to an external circumference of the sub roller 220 is layered on the target substrate TS. For example, a roller used in a typical roll-to-roll process system may be used as the sub roller 220.

As shown in FIG. 3, the main roller 230 is disposed at a location to face the transfer stage 210 with reference to the sub roller 220, the target substrate TS is rolled by being wound to the external circumference of the main roller 230, and the location of the main roller 230 can be changed to make the target substrate TS and the micro unit U press each other.

That is, the location of the main roller 230 can be changed to control a distance with the sub roller 220. For example, when the location of the main roller 230 is changed to a lower portion in FIG. 3, the target substrate TS and the micro unit U press each other, and when the location of the main roller 230 is changed to an upper portion in FIG. 3, the pressure between the target substrate TS and the micro unit U is released.

As described, the target substrate TS and the micro unit U press each other or are released from each other by changing the location of the main roller 230 to the upper portion or the lower portion in FIG. 3. Further, the target substrate TS and the micro unit U may press each other or be released from each other by enabling angle displacement between the main roller 230 and the dummy substrate DS.

That is, an angle between the main roller 230 and the dummy substrate DS may be changed according to the location of the main roller 230, and, for example, when a first end of the main roller 230 disposed in parallel with the dummy substrate DS is increased to the upper portion in FIG. 3 to make the main roller 230 and the dummy substrate DS press each other, an angle between the main roller 230 and the dummy substrate DS becomes an acute angle so that the pressure between the target substrate TS and the micro substrate U is released.

In this case, the degree of angle change between the main roller 230 and the dummy substrate Ds is preferably greater than the degree of angle change between the sub roller 220 and the dummy substrate DS, and this is to easily change an angle between the sub roller 220 and the dummy substrate DS after the angle displacement between the main roller 230 and the dummy substrate DS is occurred.

In order to effectively attach the micro unit U provided on the dummy substrate DS to the polymer layer 222a of the sub roller 220, a first adhering process means 240 is provided at one side of the sub roller 220 to provide adhering force that is stronger than adhering force between the dummy substrate DS and the micro unit U between the polymer layer 222a of the sub roller 220 and the micro unit U.

That is, when the adhering force between the dummy substrate DS and the micro unit U is "c" and the adhering force between the polymer layer 222a of the sub roller 220 and the micro unit U is "d", the first adhering process means 240 is provided to make the adhering force between the polymer layer 222a of the sub roller 220 and the micro unit U equal to "d" for "c<d".

As in the first exemplary embodiment, a surface treating device using plasma, a surface treating device using self-assembled monolayers (SAMs), an irradiation device irradiating laser, ultraviolet rays, or ion beam, or a temperature control device may be used as the first adhering process means 240.

In addition, in order to effectively attach the micro unit U attached to the polymer layer 222a that is the external circumference of the sub roller 220 to the target substrate TS, a second adhering process means 240 is provided at one side of the main roller 230 to provide adhering force that is stronger than adhering force between the polymer layer 222a of the sub roller 220 and the micro unit U between the target substrate TS and the micro unit U.

That is, when the adhering force between the polymer layer 222a of the sub roller 220 and the micro unit U is "d" and the adhering force between the target substrate TS and the micro unit U is "e", the second adhering process means 250 is provided to make the adhering force between the target substrate TS and the micro unit U equal to "e" for "d<e".

A second adhering process means 250' may also be provided at a second end of the sub roller 220 rather than providing the second adhering process means 250 at the first side of the sub roller 220 as shown in FIG. 3.

Like the first adhering process means 240, a surface treating device using plasma, a surface treating device using self-assembled monolayers (SAMs), an irradiation device irradiating laser, ultraviolet rays, or ion beam, or a temperature control device may be used as the second adhering process means 250.

In the case that the temperature control device is used as the first adhering process means 240 and the second adhering process means 250, the first adhering process means 240 (i.e., first temperature control device) controls the temperature of the polymer layer 222a to be lower than that of the dummy substrate DS to make the adhering force between the polymer layer 222a and the micro unit U stronger than the adhering force between the dummy substrate DS and the micro unit U, and the second adhering process means 250 (i.e., second temperature device) controls the temperature of the target substrate TS to be lower than that of the polymer layer 222a to make the adhering force between the target substrate TS and the micro unit U stronger than the adhering force between the polymer layer 222a and the micro unit U.

Meanwhile, when the target substrate TS where the wiring is already formed is used alignment between the target substrate TS and the micro unit U is required, and thus the alignment with the micro unit U needs to be considered when forming the micro unit U on the dummy substrate DS in the first exemplary embodiment. The alignment between the target substrate TS and the micro unit U may be achieved by setting a predetermined pattern in the external circumference of the sub roller 220.

Figure 4:
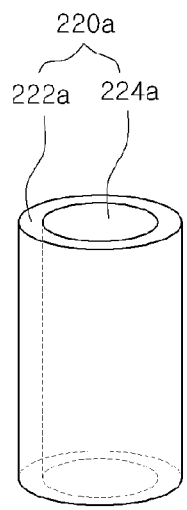
FIG. 4 shows the shape of a sub roller of the apparatus the hierarchical structure according to the second exemplary embodiment of the present invention.
Figure 4:
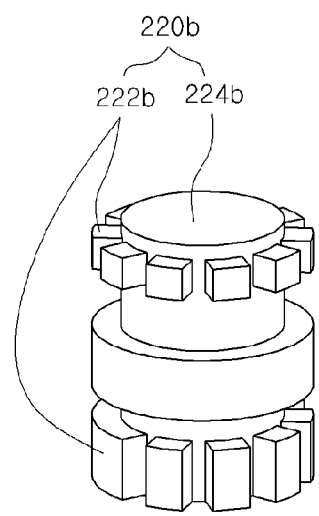

That is, as shown in (b) of FIG. 4, when the predetermined pattern is set in the sub roller 220 and thus the polymer layer 222b of the sub roller 2220 has protrusions and depressions, the micro unit U provided on the dummy substrate DS is layered on the target substrate TS corresponding to the pattern of the polymer layer 222b of the sub roller 220. As described, additional alignment of the micro unit U on the dummy substrate DS is not required even through the target substrate TS where the wiring is already formed is used by setting the predetermined pattern in the external circumference of the sub roller 220.

The pattern formed on the external circumference of the sub roller 220 partially contacts a plurality of micro units U provided on the dummy substrate DS, and accordingly, micro units U contacting the pattern formed on the external circumference of the sub roller 220 are separated from the dummy substrate DS and transferred to the target substrate TS. Therefore, the micro units U may be densely arranged on the dummy substrate DS and not densely arranged on the target substrate TS. Though such a method, a distance between the micro units U on the target substrate TS may be different from the dummy substrate.

Third Exemplary Embodiment

Figure 5:
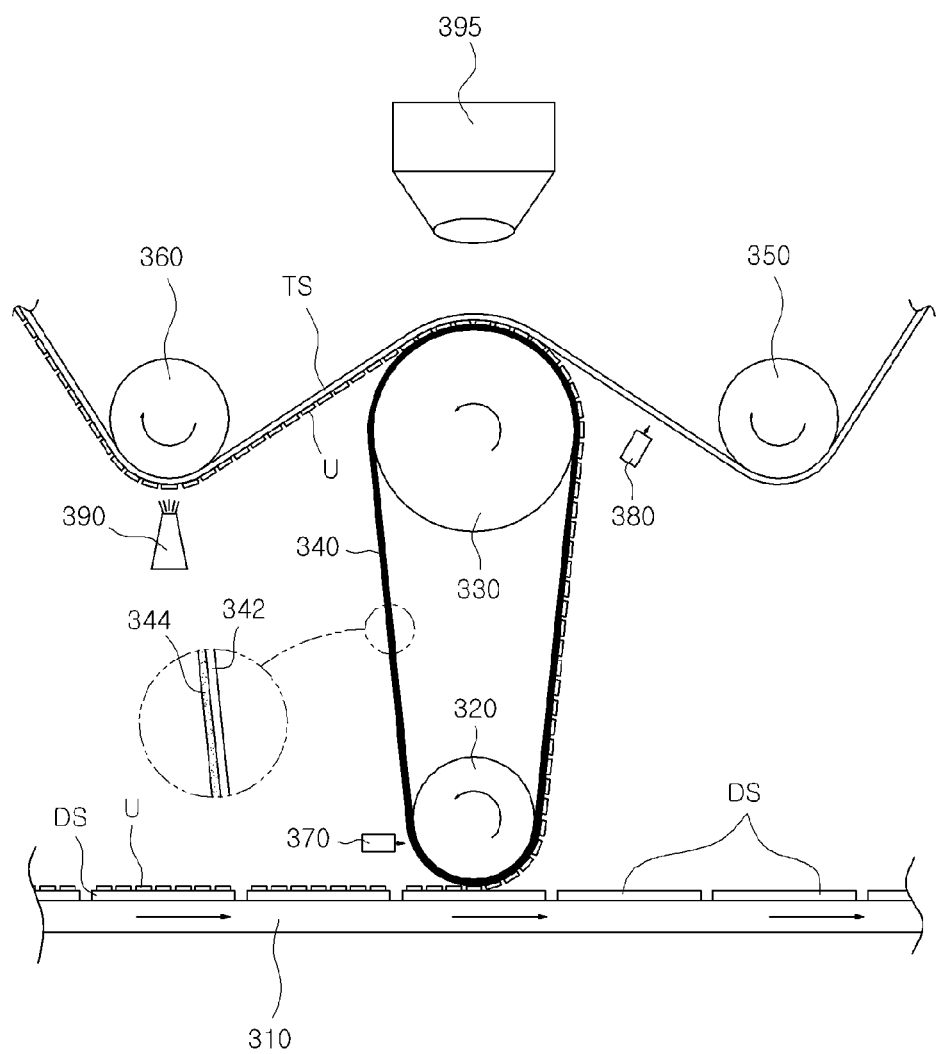
FIG. 5 to FIG. 7 show a configuration of an apparatus for manufacturing a hierarchical structure according to a third exemplary embodiment of the present invention.

As shown in FIG. 5, an apparatus for manufacturing a hierarchical structure according to a third exemplary embodiment includes a transfer stage 310, a first sub roller 320, a second sub roller 330, a ring belt 340, a first tension roller 350, and a second tension roller 360, and the transfer stage 310 is the same as the transfer stage 110 of the first exemplary embodiment and therefore no further description will be described. A dummy substrate DS, a target substrate TS, and a micro unit U of the third exemplary embodiment are the same as those of the first exemplary embodiment, and therefore no further description will be provided.

The first sub roller 320 and the second sub roller 330 are provided to circulate the ring belt 340. The first sub roller 320 is disposed close to a micro unit U provided on an upper surface of a flat-transferred dummy substrate DS and the second sub roller 330 is disposed at a predetermined distance from the first sub roller 320.

The ring belt 340 is circulated by being wound to the first sub roller 320 and the second sub roller 330. In this case, the ring belt 340 is rolled by being wound to the first sub roller 320 to make the ring belt 340 and the dummy substrate DS press each other such that the micro unit U of the dummy substrate DS is attached to the ring belt 340 of the micro unit U.

The first tension roller 350 and the second tension roller 360 are respectively provided at both sides of the second sub roller 330, and as shown in FIG. 5, the first tension roller 350 is provided at one side of the second sub roller 330 to perform rolling for supplying of the target substrate TS and the second tension roller 360 is provided at the other side of the second sub roller 330 to perform rolling for emission of the target substrate TS.

The target substrate TS disposed between the first tension roller 350 and the second tension roller 360 is in the pressure state with the second sub roller 330 such that the target substrate TS and the ring belt 340 contact each other while being pressed by each other.

As described above, in the case that the ring belt 340 is circulated by the first sub roller 320 and the second sub roller 330 and the target substrate TS is supplied from one side to the other side by the first tension roller 350 and the second tension roller 360, the micro unit U of the dummy substrate DS is attached to a portion of the ring belt 340 pressed by the first sub roller 320 and thus circulated to the second sub roller 330, and then the ring belt 340 and the target substrate TS press each other by the second sub roller 330 such that the micro unit U is finally layered on the target substrate TS.

In this case, as shown in FIG. 5, it is preferred that a portion of the ring belt 340 where the first sub roller 320 and the second sub roller 330 contact each other is formed of a metal sheet 342 and a portion where the micro unit U is attached is formed of a first polymer layer 344.

Figure 7:
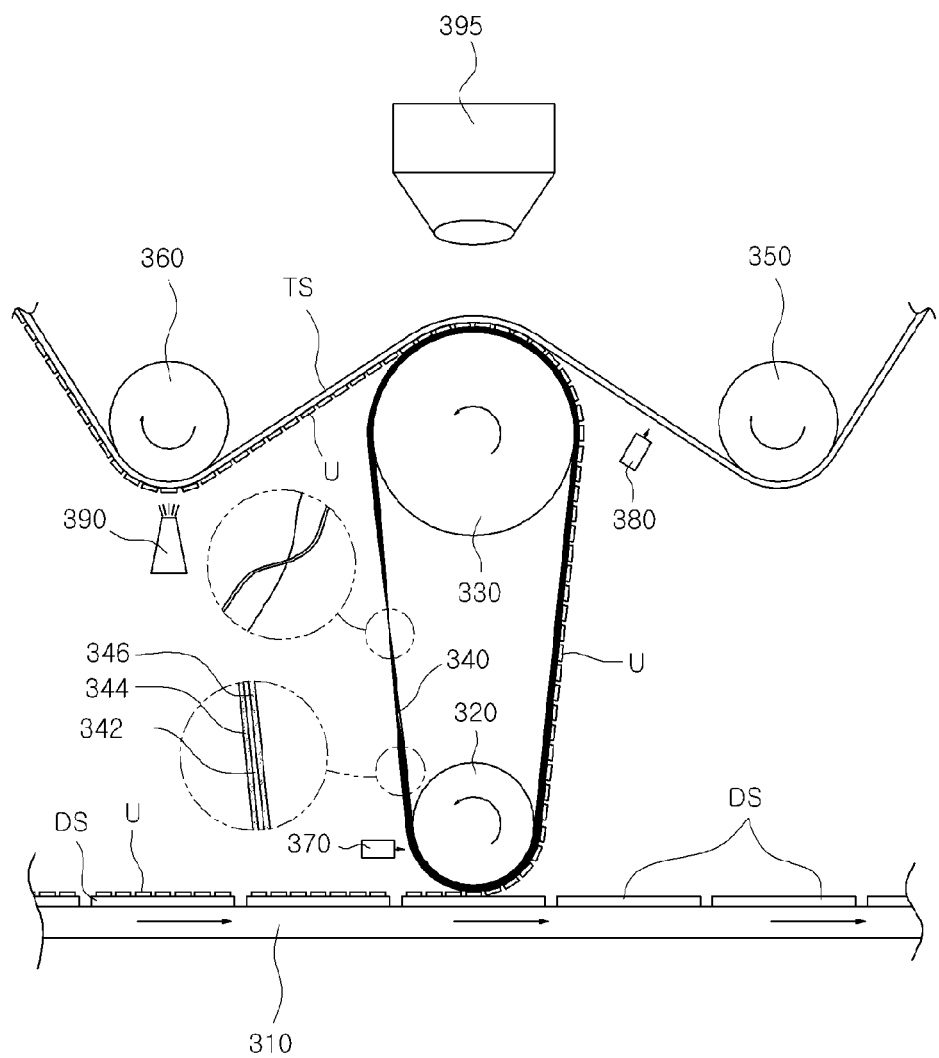

Alternatively, as shown in FIG. 7, it is preferred that the ring belt 340 is formed in the shape of the Mobius strip, and a center portion of the ring belt 340 is formed of the metal sheet 342, and the first polymer layer 344 and the second polymer layer 346 are formed at both side of the metal sheet 342. As the ring belt 340 is formed in the shape of the Mobius strip, a first side surface and a second side surface of the ring belt 340 can be used, and accordingly the life span of the ring belt 340 is extended.

Locations of the first sub roller 320, the second sub roller 330, the first tension roller 350, and the second tension roller 360 can be changed, and particularly, the locations of the first tension roller 350 and the second tension roller 360 can be changed to control the pressure degree between the ring belt 340 and the target substrate TS by the second sub roller 330.

In order to effectively attach the micro unit U provided on the dummy substrate DS to the ring belt 340, a third adhering process unit 370 is provided at one side of the first sub roller 320 to provide adhering force that is stronger than adhering force between the dummy substrate DS and the micro unit U between the ring belt 340 and the micro unit U.

That is, when the adhering force between the dummy substrate DS and the micro unit U is "f" and the adhering force between the ring belt 340 and the micro unit U is "g", the third adhering process means is provided to make the adhering force generated between the ring belt 340 and the micro unit U equal "g" for "f<g".

As in the first exemplary embodiment, a surface treating device using plasma, a surface treating device using self-assembled monolayers (SAMs), an irradiation device irradiating laser, ultraviolet rays, or ion beam, or a temperature control device may be used as the third adhering process means 370.

In order to effectively attach the micro unit U attached to the ring belt 340 to the target substrate TS, a fourth adhering process means 380 is provided at one side of the second sub roller 330 to provide adhering force that is stronger than adhering force between the ring belt 340 and the micro unit U between the target substrate TS and the micro unit U.

That is, when the adhering force between the ring belt 340 and the micro unit U is "g" and the adhering force between the target substrate TS and the micro unit U is "h", the fourth adhering process means 380 make the adhering force between the target substrate TS the micro unit U equal to "h" for "g<h".

Like the third adhering process means, a surface treating device using plasma, a surface treating device using self-assembled monolayers (SAMs), an irradiation device irradiating laser, ultraviolet rays, or ion beam, or a temperature control device may be used as the fourth adhering process means 380.

In the case that the temperature control device is used as the third adhering process means 370 and the fourth adhering process means 380, the temperature processed by the temperature control device of the fourth adhering process means 380 is controlled to be lower to the temperature processed by the temperature control device of the third adhering process means 370 to make the adhering force g between the ring belt 340 and the micro unit U greater than the adhering force h between the target substrate TS and the micro unit U.

In the case that a temperature control device is used as the third adhering process means 370 and the fourth adhering process means 380, the third adhering process means 370 (i.e., third temperature control device) controls the temperature of the ring belt 340 to be lower than the temperature of the dummy substrate DS to make the adhering force between the ring belt 340 and the micro unit U greater than the adhering force between the dummy substrate DS and the micro unit U, and the fourth adhering process means 380 (i.e., fourth temperature control device) controls the temperature of the target substrate TS to be lower than the ring belt 340 to make the adhering force between the target substrate TS and the micro unit U greater than the adhering force between the ring belt 340 and the micro unit U.

A spray nozzle 390 is provided at one side of the second tension roller 360 that makes the target substrate TS emitted to spray coating solution to the target substrate TS where the micro unit U is layered. The coating solution is sprayed through the spray nozzle 390, the coating solution can be uniformly coated on the target substrate TS using an additional means, and the coating solution coated on the target substrate TS can be changed into solid using an additional temperature control device.

The spray nozzle 390 is used as a means to spray a polymer resin or conductive ink, and may be used as a conventional spray injector or an inkjet nozzle. Further, micro units U layered on the target substrate TS may be electrically connected using a nozzle spraying conductive ink.

An alignment control module 395 is provided at a location disposed opposite to the second sub roller 330 to monitor alignment of the micro unit U layered on the target substrate TS and control the alignment of the micro unit U. That is, alignment between the target substrate TS and the micro unit U is required when using the target substrate TS where the wiring is already formed in the first exemplary embodiment, and therefore alignment between the dummy substrate DS and the micro unit U is required when forming the micro unit U on the dummy substrate DS. Thus, the alignment control module 395 is used to control alignment between the target substrate TS and the micro unit U while optically observing the target substrate TS and a portion where the micro unit U.

Figure 6:
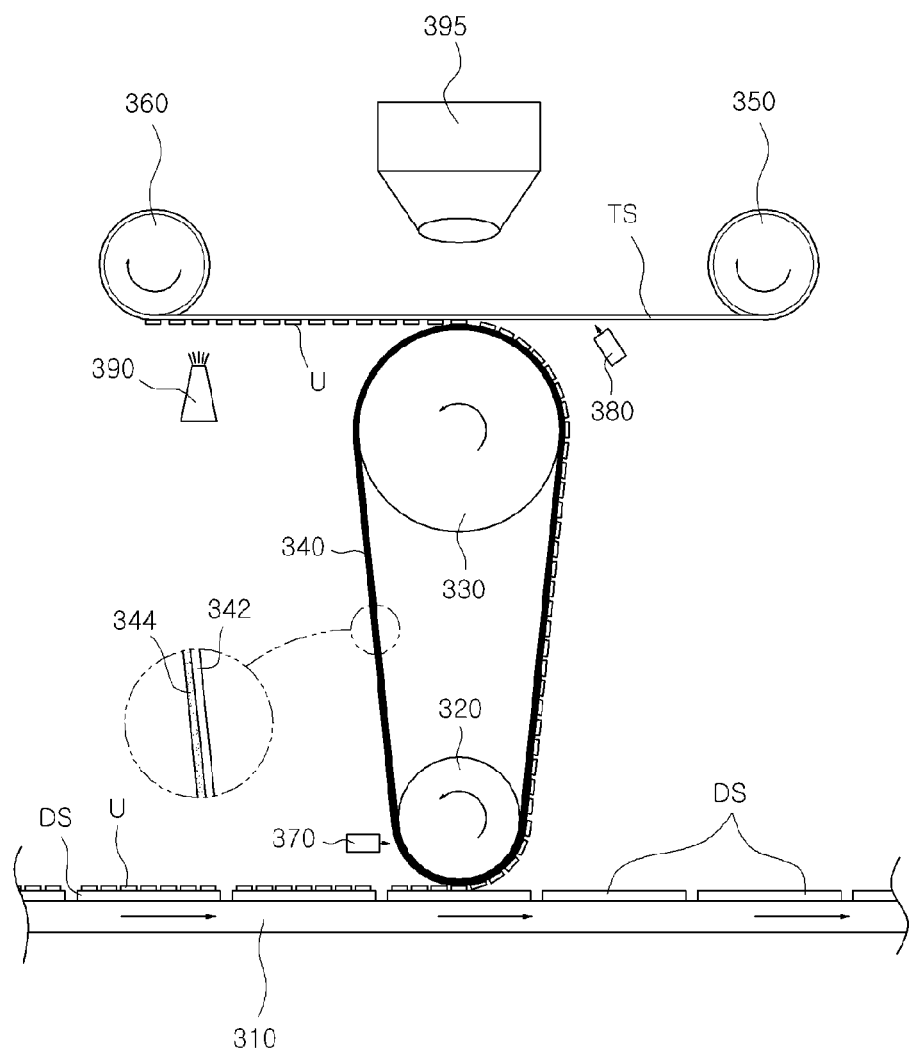

Meanwhile, as shown in FIG. 6, the first tension roller located at a supply side of the target substrate TS is set as an unwinding roller and the second tension roller 360 located at an emission side of the target substrate TS is set as a winding roller, and a distance between the first tension roller 350 and the second tension roller 360 is controlled to control tension of the target substrate TS such that the micro unit U can be layered while in the state that a tension deformation ratio is being generated. The flexible product manufactured through the above-stated process becomes strong to an external tension deformation ratio.

Fourth Exemplary Embodiment

Figure 8:
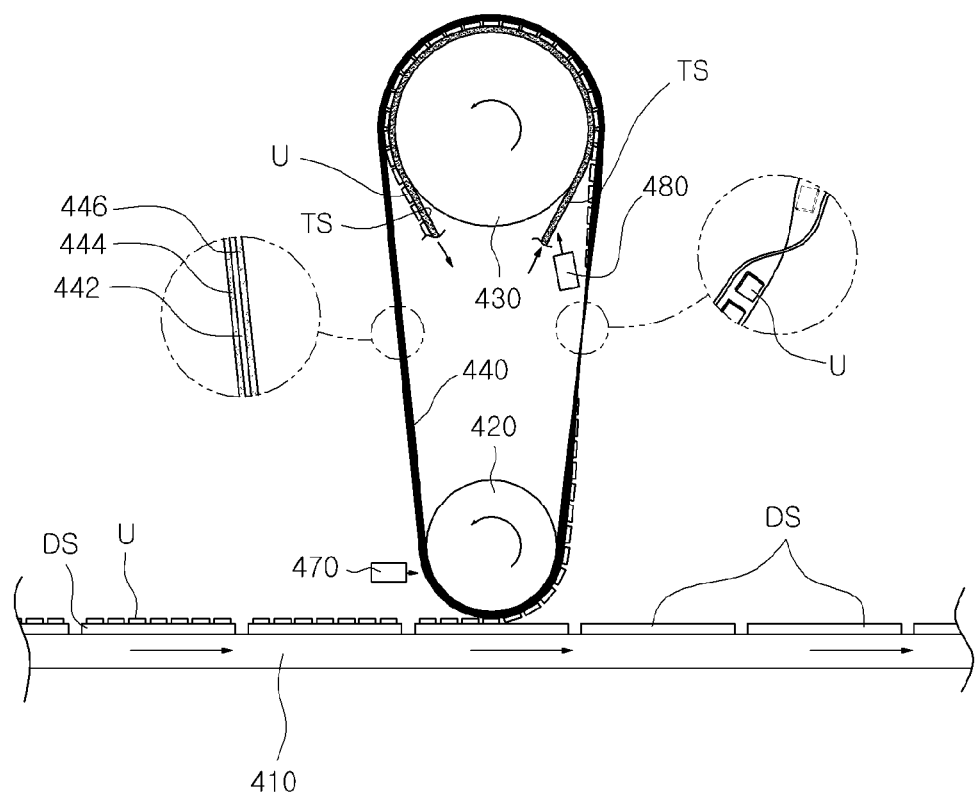
FIG. 8 shows a configuration of an apparatus for manufacturing a hierarchical structure according to a fourth exemplary embodiment of the invention.

As shown in FIG. 8, an apparatus for manufacturing a hierarchical structure according to the fourth exemplary embodiment includes a transfer stage 410, a sub roller 420, a main roller 430, and a ring belt 440. The transfer stage 410 is the same as the transfer stage 110 of the first exemplary embodiment and therefore no further description will be provided. A dummy substrate DS, a target substrate TS, and a micro unit U of the fourth exemplary embodiment are the same as those of the first exemplary embodiment, and therefore no further description will be provided.

The sub roller 420 and main roller 430 circulate the ring belt 440, and the sub roller 420 is disposed close to micro units U provided on an upper surface of the flat-transferred dummy substrate DS and the main roller 430 is disposed at a predetermined distance from the sub roller 420.

The ring belt 440 is circulated by being wound to the sub roller 420 and the main roller 430. In this case, the sub roller 420 rolls the ring belt 440 to make the ring belt 440 and the dummy substrate DS press each other such that the micro units U of the dummy substrate DS are attached to the ring belt 440.

The target substrate TS is supplied through the main roller 430 and one side of the ring belt 440 and then emitted between the main roller 430 and the other side of the ring belt 440, and the target substrate TS may be in the pressed state due to pressure between the main roller 430 and the ring belt 440.

As described above, when the ring belt 440 is circulated by the sub roller 420 and the main roller 430 and the target substrate TS is supplied between the main roller 430 and one side of the ring belt 440 and then emitted between the main roller 430 and the other side of the ring belt 440, the micro units U of the dummy substrate DS is attached to a portion of the ring belt 440 pressed by the sub roller 420 and thus circulated to the main roller 430 side, and then finally layered on the target substrate TS as the ring belt 440 and the target substrate TS are pressed by the main roller 430.

In this case, as shown in FIG. 8, it is preferred that the ring belt 440 is formed in the shape of the Mobuis strip, and a center portion of the ring belt 440 is formed of a metal sheet 442 and third and fourth polymer layers 444 and 446 are formed at both sides of the metal sheet 442.

Locations of the sub roller 420 and the main roller 430 can be respectively changed, and particularly, the location of the main roller 430 can be changed such that a pressure degree of the ring belt 440 and the target substrate TS can be controlled by the main roller 430.

In order to effectively attach the micro units U provided on the dummy substrate DS to the ring belt 440, a fifth adhering process means 470 is provided at one side of the sub roller 420 to provide adhering force that is stronger than adhering force between the dummy substrate DS and the micro unit U between the ring belt 440 and the micro unit U.

That is, when adhering force between the dummy substrate DS and the micro unit U is "i" and adhering force between the ring belt 440 and the micro unit U is "j", the fifth adhering process means 470 is provided to make the adhering force generated between the ring belt 440 and the micro unit U equal "j" for "i<j".

As in the first exemplary embodiment, a surface treating device using plasma, a surface treating device using self-assembled monolayers (SAMs), an irradiation device irradiating laser, ultraviolet rays, or ion beam, or a temperature control device may be used as the fifth adhering process means 470.

In order to effectively attach the micro unit U attached to the ring belt 440 to the target substrate TS, a sixth adhering process means 480 is provided at one side of the main roller 430 to provide adhering force that is stronger than adhering force between the ring belt 440 and the micro unit U between the target substrate TS and the micro unit U.

That is, when the adhering force between the ring belt 440 and the micro unit U is "j" and the adhering force between the target substrate TS and the micro unit U is "k", the sixth adhering process means 480 makes the adhering force generated between the target substrate TS and the micro unit U equal to "k" for "j<k".

Like the fifth adhering process means 470, a surface treating device using plasma, a surface treating device using self-assembled monolayers (SAMs), an irradiation device irradiating laser, ultraviolet rays, or ion beam, or a temperature control device may be used as the sixth adhering process means 480.

In the case that the temperature control device is used as the fifth adhering process means 470 and the sixth adhering process means 480, the temperature processed by the temperature control device of the sixth adhering process means 480 is controlled to be lower to the temperature processed by the temperature control device of the fifth adhering process means 470 to make the adhering force k between the ring belt 440 and the micro U greater than the adhering force j between the target substrate TS and the micro unit U.

In the case that a temperature control device is used as the fifth adhering process means 470 and the sixth adhering process means 480, the fifth adhering process means 470 (i.e., fifth temperature control device) controls the temperature of the ring belt 440 to be lower than the temperature of the dummy substrate DS to make the adhering force between the ring belt 440 and the micro unit U greater than the adhering force between the dummy substrate DS and the micro unit U, and the sixth adhering process means 480 (i.e., sixth temperature control device) controls the temperature of the target substrate TS to be lower than the ring belt 440 to make the adhering force between the target substrate TS and the micro unit U greater than the adhering force between the ring belt 440 and the micro unit U.

Meanwhile, a spray nozzle spraying a polymer resin or conductive ink may be provided at the micro unit U layered on the target substrate TS, and the polymer resin or the conductive nozzle is sprayed through the spray nozzle and the polymer resin or the conductive ink can be uniformly sprayed using pressure force between the main roller 430 and the ring belt 440. The polymer resin or the conductive ink can be in the solid state by hardening the polymer resin or the conductive ink by controlling temperature using the sixth adhering process means 480 (i.e., the sixth temperature control device).

The spray nozzle is used as a means to spray a polymer resin or conductive ink, and a conventional spray injector or an inkjet nozzle can be used as the spray nozzle. The micro units U layered on the target substrate TS may be electrically connected using the nozzle spraying the conductive ink.

Figure 9:
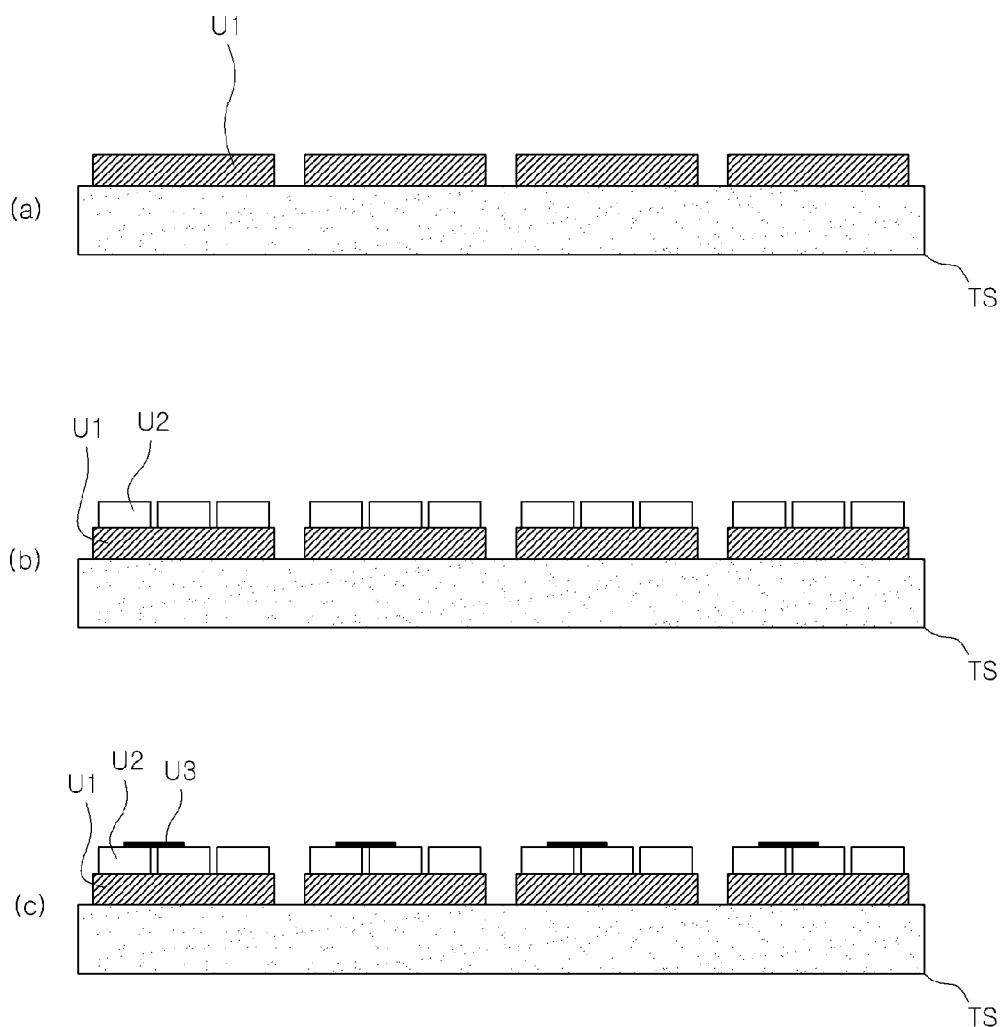
FIG. 9 shows a process for forming a hierarchical structure by layering a different micro unit for each layer.

As described above, as shown in FIG. 9, a first micro unit U1 is first layered on the target substrate TS, a second micro unit U2 is next layered thereon, and a third micro unit U is finally layered thereof using the apparatuses for manufacturing the hierarchical structure of the first exemplary embodiment, the second exemplary embodiment, the third exemplary embodiment, and the fourth exemplary embodiment such that a multi-layered hierarchical structure can be manufactured.

Figure 10:
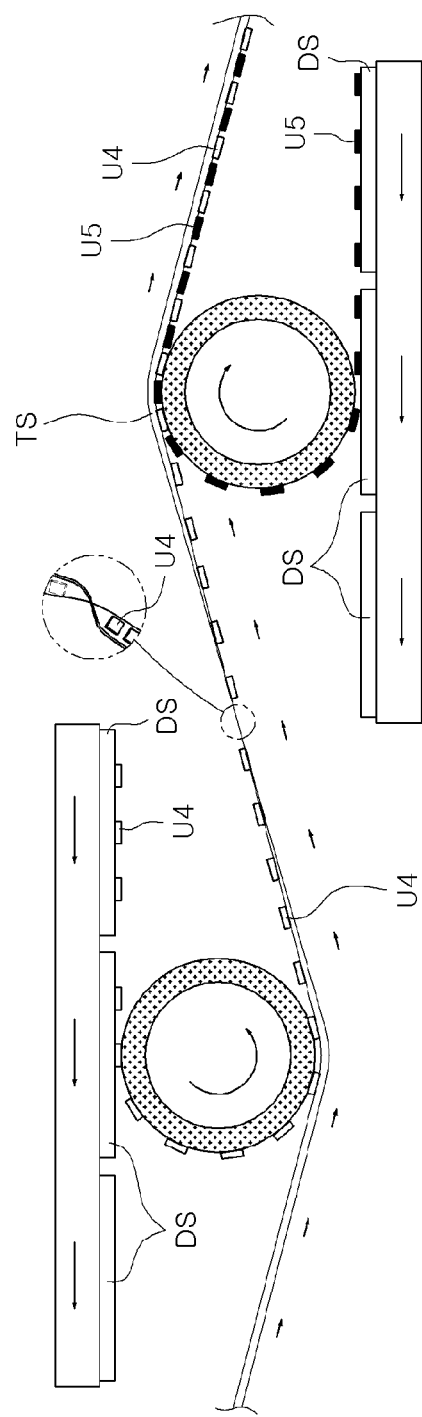
FIG. 10 shows a configuration having two apparatuses for manufacturing a hierarchical structure according to a further exemplary embodiment of the invention.

For example, as shown in FIG. 10, a first apparatus for manufacturing a hierarchal structure is provided at one side and a second apparatus for manufacturing a hierarchal structure is provided in series with the first apparatus, and different micro units U4 and U5 are respectively supplied to the first and second apparatuses to thereby sequentially aligning the micro units U4 and U5 on one target substrate TS.

As described above, various types of micro units U4, U5, . . . can be aligned on one target substrate TS by additionally providing the hierarchical structure manufacturing apparatus in addition to the case of serially connecting a plurality of a plurality of hierarchical structure manufacturing apparatuses.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

INDUSTRIAL APPLICABILITY

As described, since the present invention can be applied to massive production of flexible products by utilizing a high performance element manufactured using conventional silicon and compound semiconductor technology and a nano technology, and a hierarchically structured complex material can be massively manufactured by forming various-scaled structures on a flexible substrate, the present invention has industrial applicability.

The invention claimed is:

1. An apparatus for manufacturing a hierarchical structure for layering a micro unit provided on a dummy substrate that is made of a hard material on a target substrate that is made of a flexible material by releasing the micro unit from the dummy substrate, comprising:
   a transfer stage flat-transferring the dummy substrate by supporting the dummy substrate;
   a main roller rolling the target substrate by winding the dummy substrate as the transfer stage proceeds and layering the micro unit of the dummy substrate on the target substrate; and
   a sub roller provided between the dummy substrate and the target substrate and rotating with pressure while being in contact with the dummy substrate such that the micro unit of the dummy substrate is attached to an external circumference of the sub roller,
   wherein the main roller rolls the target substrate by winding the same to make the sub roller and the target substrate press each other and controls the micro unit attached to the external circumference of the sub roller on the target substrate.

2. The apparatus of claim 1, wherein a first adhering process means is provided at one side of the sub roller to provide adhering force that is stronger than adhering force between the dummy substrate and the micro unit between the sub roller and the micro unit.

3. The apparatus of claim 2, wherein
   the first adhering process means is selected from a surface treating device using plasma, a surface treating device using self-assembled monolayers (SAMs), and an irradiation device irradiating laser, ultraviolet rays, or ion beam, or
   the first adhering process means is formed as a first temperature control device that controls the temperature of the external circumference of the sub roller to be lower than the temperature of the dummy substrate.

4. The apparatus of claim 1, wherein a
   first adhering process means is provided at one side of the sub roller to provide adhering force that is stronger than adhering force between the dummy substrate and the micro unit between the sub roller and the micro unit, and
   a second adhering process means is provided at the other side of the sub roller to provide adhering force that is stronger that adhering force between the sub roller and the micro unit between the target substrate and the micro unit.

5. The apparatus of claim 1, wherein the sub roller has a predetermined pattern in the external circumference thereof.

6. The apparatus of claim 1, wherein the micro unit includes a silicon semiconductor, a compound semiconductor, a micro structure, or a nano structure.

7. An apparatus for manufacturing a hierarchical structure for layering a micro unit provided on a dummy substrate that is formed of a hard material on a target substrate that is formed of a flexible material by releasing the micro unit, comprising:
   a transfer state flat-transferring the dummy substrate by supporting the dummy substrate;
   a first sub roller disposed close to the dummy substrate;
   a second sub roller disposed at a predetermined distance from the first sub roller and close to the target substrate; and
   a ring belt circulated by being wound to the first and second sub rollers, pressed while being in contact with the dummy substrate by the first sub roller such that the micro unit of the dummy substrate is attached thereto, and pressed while being in contact with the target substrate by the second sub roller such that the micro unit is layered on the target substrate.

8. The apparatus of claim 7, wherein a third adhering process means is provided at one side of the first sub roller to provide adhering force that is stronger than adhering force between the dummy substrate and the micro unit between the first sub roller and the micro unit.

9. The apparatus of claim 8, wherein
   the third adhering process means is selected from a surface treating device using plasma, a surface treating device using self-assembled monolayers (SAMs), and an irradiation device irradiating laser, ultraviolet rays, or ion beam or
   the third adhering process means is formed as a third temperature control device that controls the temperature of the ring belt to be lower than the temperature of the dummy substrate.

10. The apparatus of claim 7, wherein a fourth adhering process means is provided at one side of the second sub roller to provide adhering force that is stronger than adhering force between the first sub roller and the micro unit between the target substrate and the micro unit.

11. The apparatus of claim 10, wherein
the fourth adhering process means is selected from a surface treating device using plasma, a surface treating device using self-assembled monolayers (SAMs), and an irradiation device irradiating laser, ultraviolet rays, or ion beam or
the fourth adhering process means is formed as a fourth temperature control device that controls the temperature of the target substrate to be lower than the temperature of the ring belt.

12. The apparatus of claim 7, wherein
a third adhering process means is provided at one side of the first sub roller to provide adhering force that is stronger that adhering force between the dummy substrate and the micro unit between the first sub roller and the micro unit, and
a fourth adhering process means is provided at one side of the second sub roller to provide adhering force that is stronger than adhering force between the first sub roller and the micro unit between the target substrate and the micro unit.

13. The apparatus of claim 7, further comprising a first tension roller disposed at a supply side of the target substrate and a second tension roller disposed at an emission side of the target substrate,
wherein the first and second tension rollers make the ring belt and the target substrate press each other by the second sub roller by applying tension to the target substrate.

14. The apparatus of claim 13, wherein a spray nozzle is provided at one side of the second tension roller to spray coating solution to a target substrate where the micro unit is layered.

15. The apparatus of claim 7, wherein a first polymer layer integrally formed at one side of a metal sheet of the ring belt has, and the micro unit of the dummy substrate is attached to the first polymer layer.

16. The apparatus of claim 15, wherein
the ring belt is formed in the shape of the Mobuis strip and a second polymer layer is integrally formed at the other end of the metal sheet, and
the micro unit of the dummy unit is attached to the first and second polymer layers.

17. The apparatus of claim 7, wherein an alignment control module is provided at a location facing the second sub roller to monitor alignment of the micro unit layered on the target substrate and control the alignment of the micro unit.

18. The apparatus of claim 7, wherein the micro unit includes a silicon semiconductor, a compound semiconductor, a micro structure, or a nano structure.

19. An apparatus for manufacturing a hierarchical structure for layering a micro unit provided on a dummy substrate that is made of a hard material on a target substrate that is made of a flexible material by releasing the micro unit, comprising:
a transfer state flat-transferring the dummy substrate by supporting the dummy substrate;
a sub roller disposed close to the dummy substrate;
a main roller disposed at a predetermined distance from the sub roller and close to the target substrate; and
a ring belt circulated by being wound to the sub roller and the main roller, pressed while being in contact with the dummy substrate by the sub roller such that the micro unit of the dummy substrate is attached thereto, and pressed while being in contact with the target substrate by the main roller such that the micro unit is layered on the target substrate,
wherein the target substrate is supplied between the main roller and one side of the ring belt and emitted between the main roller and the other side of the ring belt.

20. The apparatus of claim 19, wherein a fifth adhering process means is provided at one side of the sub roller to provide adhering force that is stronger than adhering force between the dummy substrate and the micro unit between the ring belt and the micro unit.

21. The apparatus of claim 20, wherein
the fifth adhering process means is selected from a surface treating device using plasma, a surface treating device using self-assembled monolayers (SAMs), and an irradiation device irradiating laser, ultraviolet rays, or ion beam, or
the fifth adhering process means is formed as a fifth temperature control device that controls the temperature of the ring belt to be lower than the temperature of the dummy substrate.

22. The apparatus of claim 19, wherein a sixth adhering process means is provided at one side of the main roller to provide adhering force that is stronger than adhering force between the ring belt and the micro unit between the target substrate and the micro unit.

23. The apparatus of claim 22, wherein
the sixth adhering process means is selected from a surface treating device using plasma, a surface treating device using self-assembled monolayers (SAMs), and an irradiation device irradiating laser, ultraviolet rays, or ion beam, or
the sixth adhering process means is formed as a sixth temperature control device that controls the temperature of the target substrate to be lower than the temperature of the ring belt.

24. The apparatus of claim 19, wherein
a fifth adhering process means is provided at one side of the sub roller to provide adhering force that is stronger than adhering force between the dummy substrate and the micro unit between the ring belt and the micro unit, and
a sixth adhering process means is provided at one side of the main roller to provide adhering force that is stronger than adhering force between the ring belt and the micro unit between the target substrate and the micro unit.

25. The apparatus of claim 19, wherein
a third polymer layer is integrally formed at one side of a metal sheet of the ring belt, and
the micro unit of the dummy substrate is attached to the third polymer layer.

26. The apparatus of claim 25, wherein the ring belt is formed in the shape of the Mobuis strip and a fourth polymer layer is integrally formed at the other end of the metal sheet, and the micro unit of the dummy unit is attached to the third and fourth polymer layers.

27. The apparatus of claim 19, wherein the micro unit includes a silicon semiconductor, a compound semiconductor, a micro structure, or a nano structure.

* * * * *